(12) United States Patent
Yamadera et al.

(10) Patent No.: US 11,936,363 B2
(45) Date of Patent: Mar. 19, 2024

(54) BONDED BODY

(71) Applicant: NGK Insulators, Ltd., Nagoya (JP)

(72) Inventors: Takahiro Yamadera, Nagoya (JP); Saki Nakayama, Fujiyoshida (JP)

(73) Assignee: NGK INSULATORS, LTD., Nagoya (JP)

( * ) Notice: Subject to any disclaimer, the term of this patent is extended or adjusted under 35 U.S.C. 154(b) by 43 days.

(21) Appl. No.: 17/818,762

(22) Filed: Aug. 10, 2022

(65) Prior Publication Data

US 2022/0385265 A1 Dec. 1, 2022

Related U.S. Application Data

(63) Continuation of application No. PCT/JP2021/042542, filed on Nov. 19, 2021.

(30) Foreign Application Priority Data

Mar. 10, 2021 (JP) .................. 2021-038022

(51) Int. Cl.
*H03H 9/02* (2006.01)
*H03H 3/08* (2006.01)
*H03H 9/25* (2006.01)

(52) U.S. Cl.
CPC .......... *H03H 9/02574* (2013.01); *H03H 3/08* (2013.01); *H03H 9/02559* (2013.01); *H03H 9/25* (2013.01)

(58) Field of Classification Search
CPC .............................. H03H 3/08; H03H 9/02559
See application file for complete search history.

(56) References Cited

U.S. PATENT DOCUMENTS

| 7,213,314 B2 | 5/2007 | Abbott et al. |
| 2015/0042207 A1 | 2/2015 | Hori et al. |
| 2015/0206853 A1 | 7/2015 | Matsushita et al. |
| 2016/0358828 A1 | 12/2016 | Ide et al. |
| 2018/0175283 A1 | 6/2018 | Akiyama et al. |
| 2021/0006224 A1 | 1/2021 | Hori et al. |

FOREIGN PATENT DOCUMENTS

| JP | 2010-287718 A1 | 12/2010 |
| JP | 2016-225537 A | 12/2016 |
| JP | 2017-135553 A | 8/2017 |
| WO | 2014/038693 A1 | 3/2014 |
| WO | 2014/156507 A1 | 10/2014 |
| WO | 2015/125770 A1 | 8/2015 |
| WO | 2019/181087 A1 | 9/2019 |

OTHER PUBLICATIONS

International Search Report and Written Opinion (Application No. PCT/JP2021/042542) dated Jan. 25, 2022.

*Primary Examiner* — Derek J Rosenau

(74) *Attorney, Agent, or Firm* — BURR PATENT LAW, PLLC

(57) ABSTRACT

A bonded body has a supporting substrate composed of silicon, piezoelectric material substrate, and a bonding layer provided on a bonding surface of the supporting substrate and composed of a metal oxide. An amount of aluminum atoms on the bonding surface of the supporting substrate is $1.0\times10^{11}$ to $1.0\times10^{15}$ atoms/cm$^2$.

3 Claims, 4 Drawing Sheets (2 of 4 Drawing Sheet(s) Filed in Color)

BONDED BODY

CROSS-REFERENCE TO RELATED APPLICATIONS

This application is a continuation application of PCT/JP2021/042542, filed Nov. 19, 2021, which claims priority to Japanese Application No. JP2021-038022 filed on Mar. 10, 2021, the entire contents all of which are incorporated hereby by reference.

TECHNICAL FIELD

The present invention is related to a bonded body of a piezoelectric material substrate and supporting substrate composed of silicon.

BACKGROUND ARTS

An acoustic surface wave device, which can be functioned for a filter device or vibrator contained in a mobile phone or the like, or an acoustic wave device such as a Lamb wave device or film bulk acoustic resonator (FBAR) including a piezoelectric thin film have been known. It is known an acoustic wave device provided by adhering a supporting substrate and a piezoelectric material substrate propagating surface acoustic wave and by providing a comb electrode capable of oscillating the surface acoustic wave on a surface of the piezoelectric material substrate.

When a piezoelectric material substrate and silicon substrate are bonded, it is known to form a silicon oxide film on the surface of the piezoelectric material substrate and to directly bond the piezoelectric material substrate and silicon substrate through the silicon oxide film (Patent documents 1 and 2). When the bonding is performed, plasma beam is irradiated on the surface of the silicon oxide film and surface of the silicon substrate to activate the surfaces so that the direct bonding is performed (plasma activation method). According to the plasma activation method, the bonding can be performed at a relatively low temperature (400° C.).

(Patent document 1) Japanese patent publication No. 2016-225537A
(Patent document 2) U.S. Pat. No. 7,213,314 B2

SUMMARY OF THE INVENTION

It is necessary to bond a piezoelectric material substrate on a supporting substrate composed of silicon through a bonding layer composed of a metal oxide and to subject the piezoelectric material substrate to polishing process for providing a thinner film, for improving the piezoelectric characteristics. However, when the piezoelectric material substrate is thinned by processing, the supporting substrate composed of silicon and bonding layer composed of the metal oxide may be peeled at the interface due to the processing load. This is caused by that the adhesive strength of the metal oxide onto the surface of the silicon substrate is insufficient.

An object of the present invention is to strongly bond a piezoelectric material substrate onto a supporting substrate composed of silicon through a bonding layer composed of a metal oxide and to suppress the peeling of the piezoelectric material substrate from the supporting substrate during the processing.

The present invention provides a bonded body comprising:
a supporting substrate composed of silicon;
a piezoelectric material substrate and;
a bonding layer provided on a bonding surface of the supporting substrate, said bonding layer comprising a metal oxide;
wherein an amount of aluminum atoms on the bonding surface of the supporting substrate is $1.0 \times 10^{11}$ to $1.0 \times 10^{15}$ atoms/cm$^2$.

The present invention provides an acoustic wave device comprising:
the bonded body and;
an electrode provided on the piezoelectric material substrate.

According to the present invention, it is possible to strongly bond a piezoelectric material substrate onto a supporting substrate composed of silicon through a bonding layer composed of a metal oxide and to suppress the peeling of the piezoelectric material substrate from the supporting substrate during the processing.

BRIEF DESCRIPTION ON THE DRAWINGS

The patent application file contains at least one drawing executed in color. Copies of this patent or patent application publication with color drawing(s) will be provided by the Office upon request and payment of the necessary fee.

FIG. 1A shows the state that a bonding surface 4a of a piezoelectric material substrate 4 is activated by plasma A, FIG. 1B shows the state that the bonding surface 1a of the supporting substrate 1 is subjected to processing B, and FIG. 1C shows the state that a bonding surface 2a of a bonding layer 2 on the supporting substrate 1 is activated by plasma C.

FIG. 2A shows the state that a piezoelectric material substrate 4 and the supporting substrate 1 are bonded, FIG. 2B shows the state that a piezoelectric material substrate 4A in thinned by processing, and FIG. 2C shows the state that an electrode 6 is provided on the piezoelectric material substrate 4A.

MODES FOR CARRYING OUT THE INVENTION

The present invention will be described further in detail below, appropriately referring to drawings.

FIGS. 1A-1C and 2A-2C are diagrams for illustrating a production example of directly bonding a supporting substrate onto a piezoelectric material substrate.

Figure 1A:
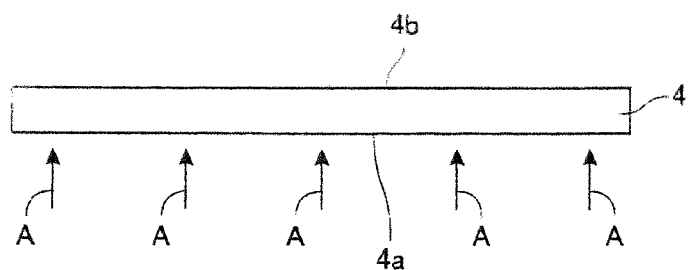
Figure 1B:
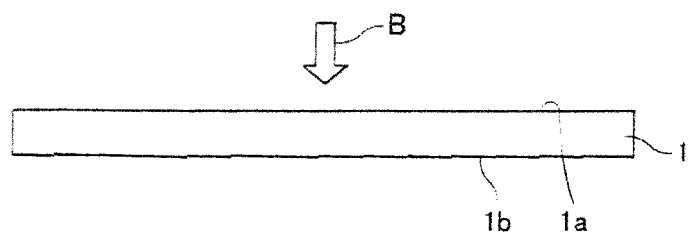
Figure 1C:
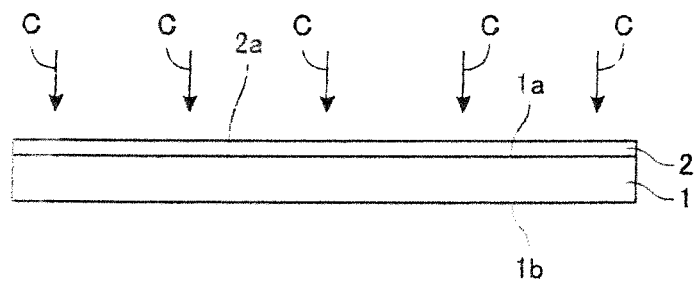

As shown in FIG. 1A, a piezoelectric material substrate 4 has main surfaces 4a and 4b. Plasma is irradiated onto the main surface 4a of the piezoelectric material substrate 4 as arrows A to activate the main surface 4a, providing an activated surface. Further, as shown in FIG. 1B, a bonding surface 1a of a supporting substrate 1 is subjected to processing B to adjust the amount of aluminum atoms. 1b represents a main surface on the opposite side of the bonding surface 1a. Then, as shown in FIG. 1C, a bonding layer 2 is provided on the bonding surface 1a of the supporting substrate 1. Then, plasma C is irradiated onto the bonding surface 2a of the bonding layer 2 to perform the activation, providing an activated surface.

Figure 2A:
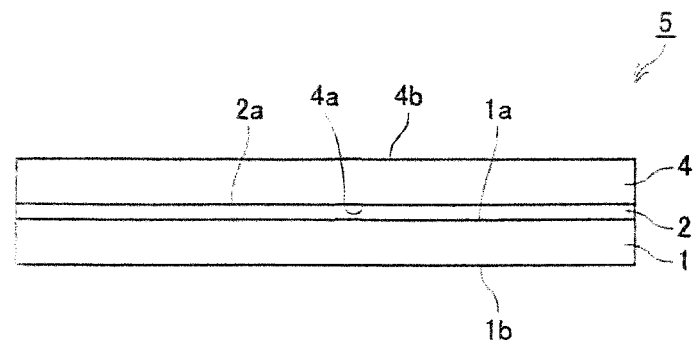

Then, as shown in FIG. 2A, the activated bonding surface 2a of the bonding surface 2 and the activated main surface 4a of the piezoelectric material substrate 4 are directedly bonded to obtain a bonded body 5.

Figure 2B:
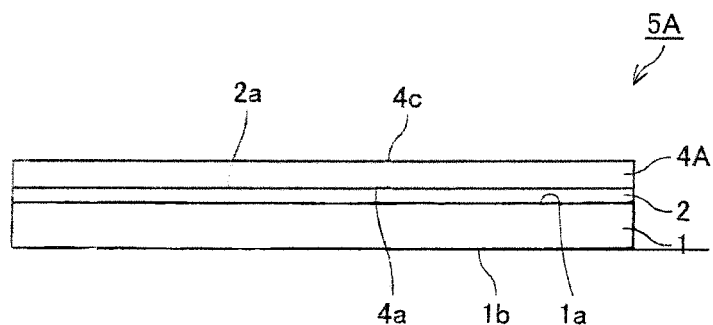

Then, the bonding surface 4b of the piezoelectric material substrate 4 of the bonded body 1 is further subjected to polishing treatment to make the thickness of the piezoelectric material substrate 4A smaller, obtaining a bonded body 5A, as shown in FIG. 2B. 4c represents a polished surface.

Figure 2C:
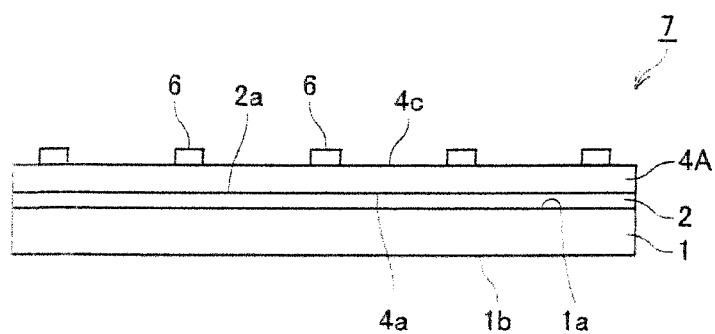

According to FIG. 2C, predetermined electrodes 6 are formed on the polished surface 4c of the piezoelectric material substrate 4A to produce an acoustic wave device 7.

According to the present invention, the supporting substrate is composed of silicon. The relative density of the supporting substrate may preferably be 95.5% or higher and may be 100%, on the viewpoint of the bonding strength. The relative density is measured by Archimedes method. Further, although the production method of the supporting substrate is not particularly limited, a sintered body may preferably be applied.

Silicon constituting the supporting substrate may preferably be a high resistance silicon. The high resistance silicon means silicon whose volume resistivity is 1000 Ω·cm or higher. The upper limit of the volume resistivity of the high resistance silicon is usually 200 kΩ·cm, on the viewpoint of production.

According to the present invention, an amount of aluminum atoms at the bonding surface of the supporting substrate is made $1.0 \times 10^{11}$ to $1.0 \times 10^{15}$ atoms/cm$^2$. That is, by making the aluminum atoms present on the bonding surface of the supporting substrate composed of silicon, it is possible to suppress the peeling along the interface between the supporting substrate and bonding layer composed of the metal oxide during the thinning process of the piezoelectric material substrate. On the viewpoint, the amount of the aluminum atoms at the bonding surface of the supporting substrate is made $1.0 \times 10^{11}$ atoms/cm$^2$ or higher, and may more preferably be $1.0 \times 10^{12}$ atoms/cm$^2$ or higher. Further, it is difficult to make the amount of the aluminum atoms at the bonding surface of the supporting substrate higher than $1.0 \times 10^{15}$ atoms/cm$^2$, on the viewpoint of the limit of production.

The amount of aluminum atoms at the bonding surface of the supporting substrate is measured by ICP-MS (Inductively coupled plasma mass spectroscopy). Specifically, the following measurement condition is applied.

That is, the bonding surface of the supporting substrate is treated by hydrogen fluoride vapor, minute contamination components on the bonding surface is then collected, and the collected solution is made a sample solution. Metal elements in the sample solution is analyzed by an ICP mass analysis system supplied by PerkinElmer, Inc.

For distributing aluminum atoms onto the bonding surface of the supporting substrate, for example, the bonding surface of the supporting substrate is subjected to polishing treatment by means of a polishing agent composed of alumina. Further, the bonding surface of the supporting substrate is subjected to blast processing by means of abrasive grains composed of alumina so that aluminum atoms are left on the bonding surface. It is considered that aluminum atoms distributed on the bonding surface of such supporting substrate contributes to the bonding with the metal oxide constituting the bonding layer to improve the adhesion strength and that it is thereby possible to assure the adhesive strength capable of enduring the processing load during the production of the piezoelectric thin film.

The grain size of the abrasive grain to be contacted with the bonding surface of the supporting substrate is preferably 1 μm to 7 μm. In the case that the grain size of the abrasive grain is smaller than 1 μm, the grain size is too small and the processing is not progressed. Particularly in the case that the grain size of the abrasive grain is 1.2 μm, it is possible to incorporate Al densely over the whole surface of the bonding surface of the supporting substrate.

The metal oxide constituting the bonding layer may preferably be selected from the group consisting of silicon oxide, sialon, cordierite, mullite and alumina, and most preferably be silicon oxide.

Sialon is a ceramic obtained by sintering mixture of silicon nitride and alumina, and has the following composition.

That is, sialon has a composition containing silicon nitride into which alumina is mixed, and z shows the mixing ratio of alumina. z may more preferably be 0.5 or higher. z may more preferably be 4.0 or lower.

Alumina is a polycrystal having a composition of $Al_2O_3$. Cordierite is a ceramic having a composition of $2MgO \cdot 2Al_2O_3 \cdot 5SiO_2$. Mullite is a ceramic having a composition in a range of $3Al_2O_3 \cdot 2SiO_2$ to $2Al_2O_3 \cdot SiO_2$.

Although the material of the piezoelectric material substrate is not particularly limited as far as it has necessary piezoelectricity, a single crystal having a composition of $LiAO_3$ is preferred. Here, A is one or more element(s) selected from the group consisting of niobium and tantalum. Thus, $LiAO_3$ may be lithium niobate, lithium tantalate, or a lithium niobate-lithium tantalate solid solution.

Silicon oxide constituting the bonding layer having a composition of $Si_{(1-x)}O_x$ ($0.008 \leq x \leq 2/3$).

According to an embodiment, the silicon oxide has a composition of $Si_{(1-x)}O_x$ ($0.008 \leq x \leq 0.408$). The composition is a composition in which the oxygen content is considerably lower than that of $SiO_2$ (corresponding with x of 0.667). As the piezoelectric material substrate is bonded with the supporting substrate through the bonding layer having such composition of silicon oxide, $Si_{(1-x)}O_x$, the insulating property of the bonding layer can be improved.

Although the thickness of the bonding layer is not particularly limited, the thickness may preferably be 0.01 to 10 μm and more preferably be 0.01 to 0.5 μm, on the viewpoint of production cost.

Although the method of film-forming the bonding layer is not limited, sputtering method, chemical vapor deposition (CVD) method and vapor deposition are exemplified. Here, more preferably, the content of oxygen gas flowing in a chamber is adjusted during the reaction sputtering applying Si as a sputtering target, so that the oxygen content (x) of the bonding layer can be controlled.

Although the specific production condition of the bonding layer is appropriately selected depending on the specification of the chamber, according to a preferred example, the total pressure is made 0.28 to 0.34 Pa, the oxygen partial pressure is made $1.2 \times 10^{-3}$ to $5.7 \times 10^{-2}$ Pa, and the film-forming temperature is made ambient temperature. Further, B-doped Si is exemplified as the Si target.

According to a preferred embodiment, the activated bonding surface of the bonding layer and activated bonding surface of the piezoelectric material substrate are directly bonded with each other. In other words, a bonding interface is present along an interface between the bonding layer and piezoelectric material substrate. In this case, the arithmetic average roughness Ra of the activated bonding surface of the bonding layer may preferably be 1 nm or lower and may more preferably be 0.3 nm or lower. Further, the arithmetic average roughness Ra of the activated bonding surface of the piezoelectric material substrate may preferably be 1 nm or lower and more preferably be 0.3 nm or lower. The bonding strength of the piezoelectric material substrate and bonding layer is further improved.

The respective constituents of the present invention will be further described below.

The applications of the bonded body of the present invention is not particularly limited, and it may be suitably applied for an acoustic wave device or optical device.

As the acoustic wave device, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric material substrate. By applying high frequency signal on the IDT electrodes on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A metal film may be provided on a bottom surface of the piezoelectric material substrate. After the Lamb type device is produced as the acoustic wave device, the metal film plays a role of improving the electro-mechanical coupling factor near the bottom surface of the piezoelectric material substrate. In this case, the Lamb type device has the structure that interdigitated electrodes are formed on the surface of the piezoelectric material substrate and that the metal film on the piezoelectric material substrate is exposed through a cavity provided in the supporting body. Materials of such metal films include aluminum, an aluminum alloy, copper, gold or the like, for example. Further, in the case that the Lamb wave type device is produced, it may be used a composite substrate having the piezoelectric material layer without the metal film on the bottom surface.

Further, a metal film and an insulating film may be provided on the bottom surface of the piezoelectric material substrate. The metal film plays a role of electrodes in the case that the thin film resonator is produced as the acoustic wave device. In this case, the thin film resonator has the structure that electrodes are formed on the upper and bottom surfaces of the piezoelectric material substrate and the insulating film is made a cavity to expose the metal film on the piezoelectric material substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric material substrate.

In the case that an object of the present invention is the acoustic wave device and the material of the piezoelectric material substrate is lithium tantalate, it is preferred to use the substrate rotated from Y-axis to Z-axis by 36 to 47° (for example 42°) around X-axis, which is a direction of propagation of a surface acoustic wave, because of a low propagation loss. Further, in the case that the piezoelectric material substrate is made of lithium niobate, it is preferred to use the substrate rotated from Y-axis to Z-axis by 60 to 68° (for example 64°) around X-axis, which is a direction of propagation of a surface acoustic wave, because of a lower propagation loss. Further, although the size of the piezoelectric material substrate 4 or 4A is not particularly limited, for example, the diameter may be 50 to 150 mm and thickness may be 0.2 to 60 μm.

The following method is preferred for obtaining the bonded body of the present invention.

First, plasma is irradiated onto the bonding surface of the bonding layer and bonding surface of the piezoelectric material substrate to activate the respecting bonding surfaces.

The atmosphere during the surface activation is made atmosphere containing nitrogen or oxygen. The atmosphere may be oxygen only, nitrogen only or mixed gases of oxygen and nitrogen, hydrogen and argon. In the case of the mixed gases, the ratio may be appropriately adjusted depending on the bonding strength, although it is not particularly limited.

The pressure of the atmosphere during the surface activation may preferably be 100 Pa or lower and 80 Pa or lower. Further, the pressure of the atmosphere may preferably be 30 Pa or higher and more preferably be 50 Pa or higher.

The temperature during the plasma irradiation is made 150° C. or lower. It is thereby possible to obtain a bonded body 7 having a high bonding strength and without deterioration of a piezoelectric material. On the viewpoint, the temperature during the plasma irradiation is made 150° C. or lower and may be preferably made 100° C. or lower.

Further, the energy during the plasma irradiation may preferably be 30 to 150 W. Further, the product of the energy and irradiation time period during the plasma irradiation may preferably be 0.1 to 1.0 Wh.

According to a preferred embodiment, the bonding surface 4a of the piezoelectric material substrate and bonding surface 2a of the bonding layer are subjected to flattening, before the plasma treatment. The method of flattening the respective bonding surfaces 2a and 4a may be lapping or chemical mechanical polishing (CMP). Further, the arithmetic average roughness Ra of the flattened surface may preferably be 1 nm or lower and more preferably be 0.3 nm or lower.

Then, the activated bonding surface of the piezoelectric material substrate and activated bonding surface of the bonding layer are contacted and bonded. Thereafter, preferably, the bonded body is subjected to thermal treatment so that it is possible to obtain a strength capable of enduring the polishing treatment of the piezoelectric material substrate. The thermal treatment may preferably be 100 to 150° C. According to the present embodiment, the piezoelectric material substrate may be processed to make the thickness smaller after the thermal treatment.

Then, the bonded body is subjected to thermal treatment (annealing) to improve the bonding strength. On the viewpoint of the present invention, the temperature of the thermal treatment is 250° C. or higher and more preferably 270° C. or higher. Further, the temperature of the thermal treatment is made 350° C. or lower and more preferably made 300° C. or lower, on the viewpoint of preventing the fracture of the bonded body.

Then, the activated surfaces are contacted and bonded with each other under vacuum atmosphere. The temperature at this time is ambient temperature, specifically 40° C. or lower and more preferably 30° C. or lower. Further, the temperature during the bonding may particularly preferably 20° C. or higher and 25° C. or lower. The pressure during the bonding may preferably be 100 to 20000 N.

EXAMPLES

The bonded bodies of the respective examples shown in table 1 were produced, according to the method described referring to FIGS. 1A-1C and 2A-2C.

Specifically, it was used a lithium tantalate substrate (LT substrate) having an OF part, a diameter of 4 inches and a thickness of 250 μm as the piezoelectric material substrate 4. It was used a 46° Y-cut X-propagation LT substrate in which the propagation direction of surface acoustic wave (SAW) is made X and the cutting angle was of rotated Y-cut plate, as the LT substrate. The surface 4a of the piezoelectric material substrate 4 was subjected to mirror surface polishing so that the arithmetic average roughness Ra reached 0.3 nm. Further, Ra is measured by an atomic force microscope (AFM) in a visual field of 10 μm×10 μm.

Further, it was prepared the supporting substrate 1 having an orientation flat (OF) part, a diameter of 4 inches and a thickness of 230 μm and composed of high-resistance (cm) silicon, as the supporting substrate 1. The surfaces 1a and 1b of the supporting substrate 1 were subjected to finishing by chemical mechanical polishing (CMP), so that the respective arithmetic average roughnesses Ra were 0.2 nm. The bonding surface of the supporting substrate was subjected to blast treatment by means of fine powder of polishing agent of white alumina having an average particle size of 2 μm, during the polishing treatment. The composition of the polishing agent was as follows.
Aluminum oxide: 96 mass % or higher
Sodium oxide, iron oxide and silicon oxide were less than 1 mass %, respectively.

The arithmetic average roughness Ra after the polishing treatment was 1 nm to 10 nm. Further, the amounts of aluminum atoms on the bonding surfaces of the supporting substrates of the respective examples were analyzed by ICP-MS and the results were shown in table 1.

Then, it was formed the bonding layer 2 composed of $SiO_2$ in 1 μm on the bonding surface of the supporting substrate and the bonding surface 2a was polished by CMP in about 0.1 μm for the flattening.

It was then performed ultrasonic cleaning by applying pure water and the bonding surfaces of the piezoelectric material substrate and bonding layer were dried by spin drying. Then, the supporting substrate after the cleaning was introduced into a plasma activation chamber and the bonding surface was activated by nitrogen gas plasma at 30° C. Further, the piezoelectric material substrate was similarly introduced into the plasma activation chamber and the bonding surface of the bonding layer was subjected to surface activation by nitrogen gas plasma at 30° C. The time period of and energy of the surface activation were made 40 seconds and 100 W, respectively. For removing particles attached during the surface activation, the ultrasonic cleaning and spin drying as described above were repeatedly performed again.

Then, the adjustment of positions of the bonding surface of the piezoelectric material substrate and bonding surface of the bonding layer was performed and the activated bonding surfaces were contacted with each other at room temperature. As the centers of the laminated substrates were pressurized, it was observed the state (so-called bonding wave) in which the adhesion of the substrates was spread, confirming that good preliminary bonding was completed.

Then, the bonded body was charged into an oven filled with nitrogen atmosphere and heated at 130° C. over 4 hours.

The surface of the piezoelectric material substrate of the bonded body taken out of the oven was subjected to grinding process and polishing process to a thickness of 1 μm.

Here, in the bonded bodies of the respective examples, the amounts of aluminum atoms at the respective bonding surfaces of the respective supporting bodies were changed by adjusting the strength of the processing (pressure of the processing) and time period for the processing. Further, the pressure of the processing was adjusted in a range of 0.1 MPa to 0.5 MPa, and the time period of the processing was adjusted in a range of 1 minute to 5 minutes. As the pressure made higher or the time period of the processing was made longer, the amount of aluminum atoms present on the bonding surface of the supporting substrate can be made higher.

TABLE 1

| Amount of Al elements (atoms/cm²) | Ratio of areas of peeled parts (%) |
|---|---|
| $2.0 \times 10^{+09}$ | 50 |
| $7.0 \times 10^{+09}$ | 30 |
| $4.0 \times 10^{+10}$ | 5 |
| $1.0 \times 10^{+11}$ | 0 |
| $2.0 \times 10^{+13}$ | 0 |
| $1.0 \times 10^{+15}$ | 0 |

As a result, in the case that the amount of aluminum atoms on the bonding surface of the supporting substrate was $2.0 \times 10^9$ atoms/cm², $7.0 \times 10^9$ atoms/cm² or $4.0 \times 10^{10}$ atoms/cm², the peeling was observed during the polishing. The ratios of the areas of the peeled parts were 50%, 30% and 5%, respectively, provided that 100% is assigned to the total area of the bonding surface.

Figure 3:
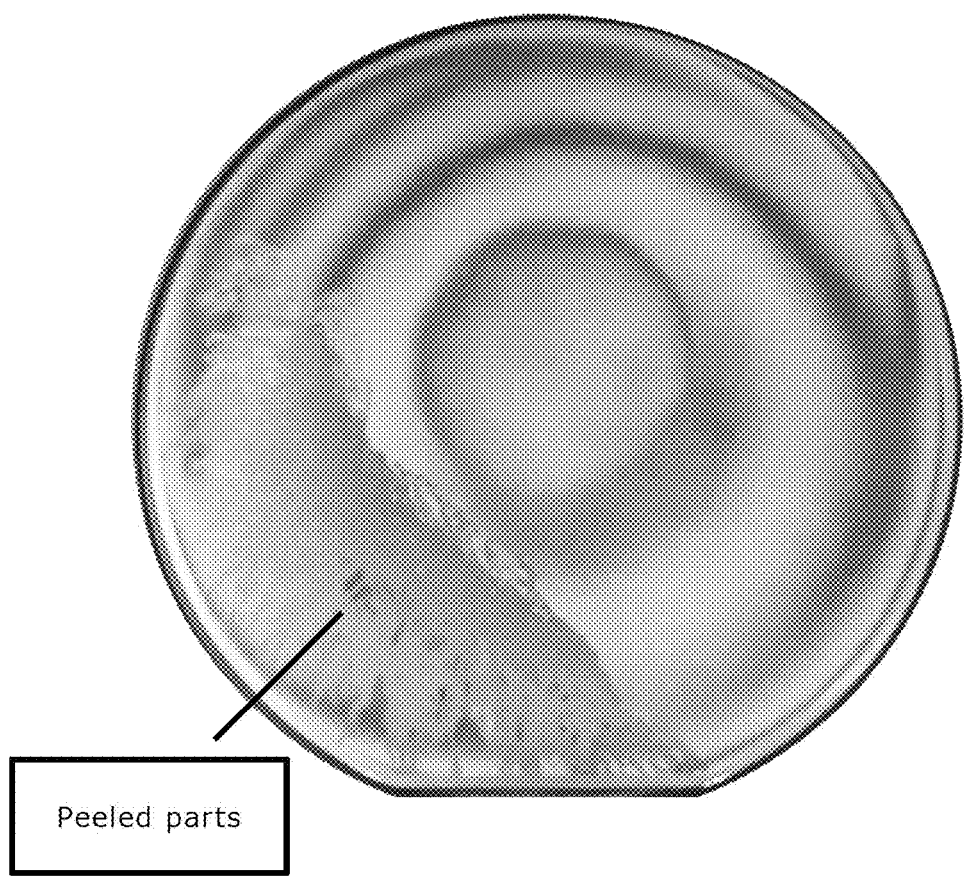
FIG. 3 is a diagram showing the state of an interface between a supporting substrate and bonding layer after a piezoelectric material substrate is subjected to polishing according to a comparative example.

Here, FIG. 3 shows an optical photograph of the bonding interface in the case that the amount of aluminum atoms was $7.0 \times 10^9$ atoms/cm², taken by a digital camera. According to the present examples, the peeled parts were generated in the lower-left side in FIG. 3, and the ratio of the area of peeled parts was 30%.

On the other hand, in the case that the amount of the aluminum atoms on the bonding surface of the supporting substrate was $1.0 \times 10^{11}$ atoms/cm², $2.0 \times 10^{13}$ atoms/cm² or $1.0 \times 10^{15}$ atoms/cm², the peeling did not occur during the polishing step. The ratio of the area of the peeled part was proved to be 0%, provided that the total area of the bonding surface is 100%.

Figure 4:
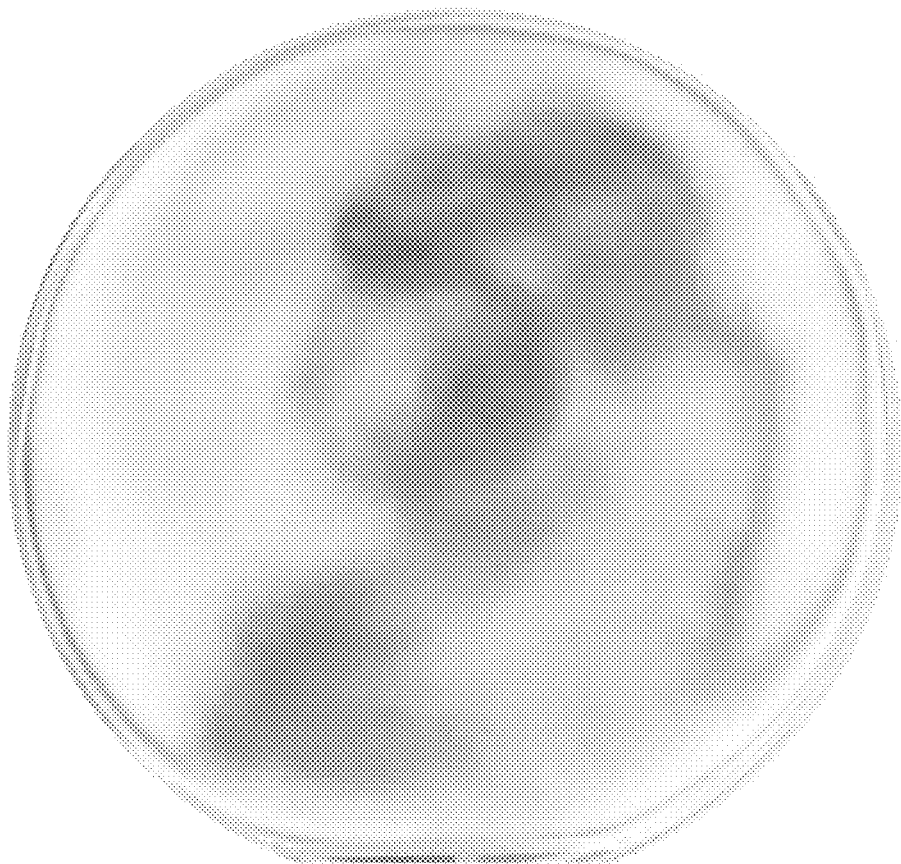
FIG. 4 is a diagram showing the state of an interface between a supporting substrate and bonding layer after a piezoelectric material substrate is subjected to polishing according to an inventive example.

FIG. 4 shows an optical photograph showing the bonding interface, in the case that the amount of aluminum atoms was $2.0 \times 10^{13}$ atoms/cm², taken by a digital camera. According to the present example, the peeled part was not generated at the bonding interface.

The invention claimed is:
1. A bonded body comprising:
a supporting substrate comprising silicon;
a piezoelectric material substrate; and
a bonding layer provided on a bonding surface of said supporting substrate, said bonding layer comprising a metal oxide;
wherein an amount of aluminum atoms on said bonding surface of said supporting substrate is $1.0 \times 10^{11}$ to $1.0 \times 10^{15}$ atoms/cm².
2. The bonded body of claim 1, wherein said metal oxide is selected from the group consisting of silicon oxide, sialon, cordierite, mullite and alumina.

3. The bonded body of claim 1, wherein said piezoelectric material substrate comprises a material selected from the group consisting of lithium niobate, lithium tantalate and lithium niobate-lithium tantalate solid solution.

* * * * *